(12) United States Patent
Chuang et al.

(10) Patent No.: US 11,638,378 B2
(45) Date of Patent: Apr. 25, 2023

(54) METHOD OF FABRICATING SEMICONDOCTOR DEVICE

(71) Applicant: Winbond Electronics Corp., Taichung (TW)

(72) Inventors: Che-Fu Chuang, Taichung (TW); Hsiu-Han Liao, Taichung (TW)

(73) Assignee: Winbond Electronics Corp., Taichung (TW)

( * ) Notice: Subject to any disclaimer, the term of this patent is extended or adjusted under 35 U.S.C. 154(b) by 238 days.

(21) Appl. No.: 17/317,872

(22) Filed: May 11, 2021

(65) Prior Publication Data

US 2022/0367496 A1    Nov. 17, 2022

(51) Int. Cl.
| | | |
|---|---|---|
| *H10B 41/40* | (2023.01) | |
| *H10B 41/49* | (2023.01) | |
| *H01L 21/311* | (2006.01) | |
| *H01L 21/3213* | (2006.01) | |

(52) U.S. Cl.
CPC ......... *H10B 41/40* (2023.02); *H01L 21/31111* (2013.01); *H01L 21/31144* (2013.01); *H01L 21/32134* (2013.01); *H01L 21/32139* (2013.01)

(58) Field of Classification Search
CPC ... H10B 41/40; H10B 41/49; H01L 21/31111; H01L 21/31144; H01L 21/32134; H01L 21/32139; H01L 29/40114
See application file for complete search history.

(56) References Cited

U.S. PATENT DOCUMENTS

| | | |
|---|---|---|
| 5,658,812 A | 8/1997 | Araki |
| 7,045,850 B2 | 5/2006 | Kim et al. |
| 8,114,744 B2 | 2/2012 | Chatterjee et al. |
| 8,741,727 B2 * | 6/2014 | Ariyoshi ............... H10B 41/49 438/257 |
| 9,368,606 B2 * | 6/2016 | Fang .................... H01L 29/792 |

* cited by examiner

*Primary Examiner* — David Vu
(74) *Attorney, Agent, or Firm* — JCIPRNET

(57) ABSTRACT

A method for fabricating a semiconductor device includes: forming a first gate dielectric layer in a first and a second regions of a peripheral region of a substrate; forming a first conductive layer and a first hard mask layer over the substrate; forming a first mask layer on the first hard mask layer in the first region; removing the first hard mask layer outside the first region; removing the first hard mask layer; performing a wet etch process by taking the first hard mask layer as a mask, and removing the first conductive layer and the first gate dielectric layer outside the first region; removing the first hard mask layer and the first conductive layer; forming a second gate dielectric layer in the second region; and forming a first and a second gate conductive layers in the first and the second regions respectively.

14 Claims, 15 Drawing Sheets

METHOD OF FABRICATING SEMICONDOCTOR DEVICE

BACKGROUND

Technical Field

The disclosure relates to a fabricating method of an integrated circuit device, and in particular to a fabricating method of a semiconductor device.

Description of Related Art

Semiconductor devices usually go through multiple etching processes during the fabricating process. However, if the etchant used is insufficient for the etch selectivity between layers, it often causes etching damage and causes electrical issues of the device.

SUMMARY

The disclosure provides a fabricating method of a semiconductor device capable of reducing or avoiding damage to an active region of a device during an etching process.

A fabricating method of a semiconductor device according to an embodiment of the disclosure includes the following. A substrate is provided. The substrate includes a cell region and a peripheral region, and the peripheral region includes a first region and a second region. A tunnel oxide, a floating conductive layer, and a stacked hard mask layer are formed in the cell region and the peripheral region. The stacked hard mask layer is taken as a mask, and the floating conductive layer and the tunnel oxide in the first region and the second region are removed. A first gate dielectric layer is formed over the substrate of the first region and the second region of the peripheral region, and a first conductive layer and a first hard mask layer are formed in the first region and the second region of the cell region and the peripheral region. The first hard mask layer outside the first region is removed. The first hard mask layer is taken as a mask, and the first conductive layer and the first gate dielectric layer outside the first region is removed. The first hard mask layer and the first conductive layer are removed. A first gate conductive layer is formed in the first region.

A fabricating method of a semiconductor device according to an embodiment of the disclosure includes the following. A substrate is provided. The substrate includes a cell region and a peripheral region, and the peripheral region includes a first region and a second region. A first gate dielectric layer is formed over the substrate of the first region and the second region of the peripheral region, and a first conductive layer and a first hard mask layer are formed in the first region and the second region of the cell region and the peripheral region. A first mask layer is formed on the first hard mask layer in the first region. The first mask layer is taken as a mask, and the first hard mask layer outside the first region is removed. The first mask layer is removed. The first hard mask layer is taken as a mask, and a wet etch process is performed to remove the first conductive layer and the first gate dielectric layer outside the first region. The first hard mask layer and the first conductive layer are removed. A first gate dielectric layer is formed in the second region. A first gate conductive layer is formed in the first region, and a second gate conductive layer is formed in the second region.

Based on the above, according to the embodiment of the disclosure, a thin gate dielectric layer of a transistor with an initial voltage relatively small is first formed in each region of a peripheral circuit region, and then a thin gate dielectric layer on a region of a transistor with an initial voltage relatively large is removed. Since a thickness of the gate dielectric layer of the transistor with an initial voltage relatively small is relatively thin, the wet etch process to remove the thin gate dielectric layer takes less time, which is less likely to cause electrical issues of the device. In addition, according to the embodiment of the disclosure, the conductive layer on the region of the transistor with an initial voltage relatively large is removed through the wet etch process, so that active regions of the device may be prevented from being damaged through etching.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
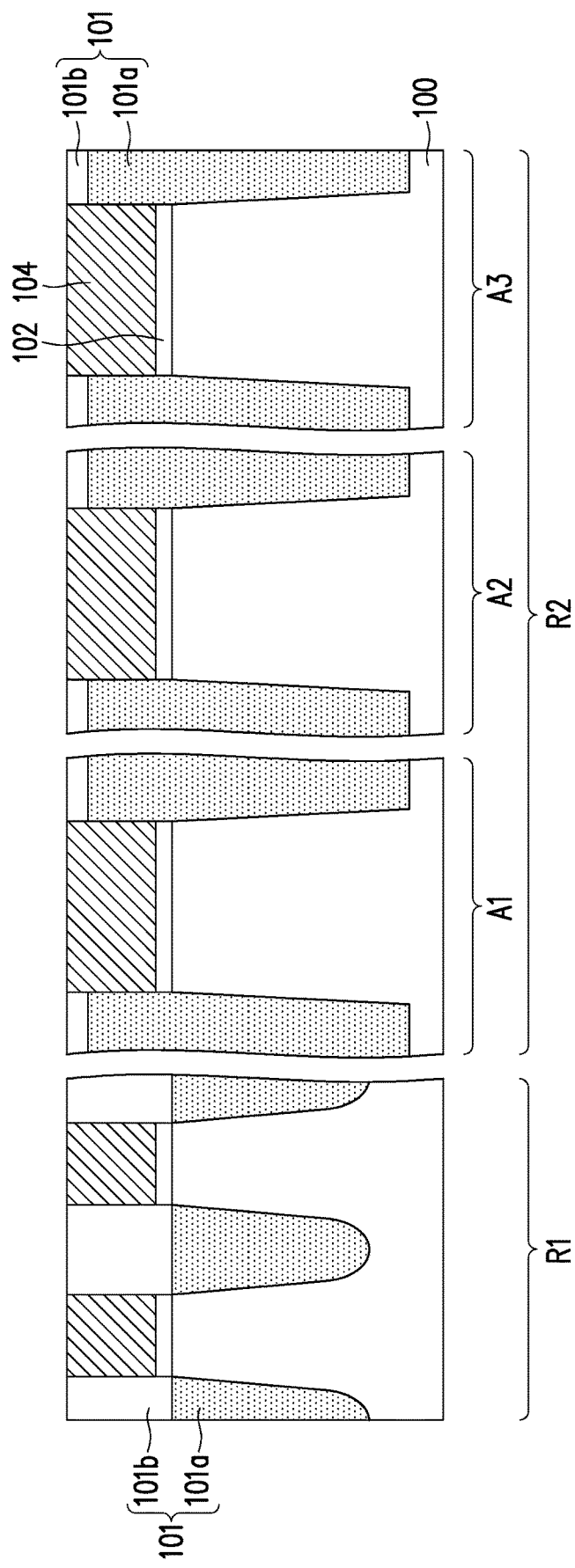
FIG. 1A to FIG. 1N are schematic cross-sectional views of a fabricating method of a semiconductor device according to embodiment of the disclosure.

With reference to FIG. 1A, a substrate 100 is provided. The substrate 100 may be a semiconductor or a semiconductor compound, such as an N-type silicon substrate or a P-type silicon substrate, a group III-V semiconductor substrate, or germanium silicide. The substrate 100 may also be silicon on insulator (SOI). The substrate 100 includes a cell region R1 and a peripheral region R2. The peripheral region R2 includes regions A1, A2, and A3 to form transistors with different initial voltages. An initial voltage of a transistor of the region A2 is higher than an initial voltage of a transistor of the region A1 and lower than an initial voltage of a transistor of the region A3. For example, the transistor of the region A2 has a low initial voltage; the transistor of the region A1 has an ultra-low initial voltage; and the transistor of the region A3 has a high initial voltage. According to some embodiments, the initial voltage of the transistor of the region A1 is less than or equal to 1.8 volts; the initial voltage of the transistor of the region A2 is about 3 volts; the initial voltage of the transistor of the region A3 is about 5 volts to Vpp.

A tunnel oxide 102 and a conductive layer 104 are formed over the substrate 100. A material of the tunnel oxide 102 is, for example, silicon oxide. The conductive layer 104 subsequently serves as a floating gate, so it may also be referred to as a floating conductive layer. A material of the conductive layer 104 is, for example, doped polysilicon. A thickness of the tunnel oxide 102 is, for example, 8 nm to 11 nm. A thickness of the conductive layer 104 is, for example, 50 nm to 90 nm.

Next, an isolation structure 101 is formed in the substrate 100 to define multiple active regions in the regions A1, A2, and A3 of the cell region R1 and the peripheral region R2.

The isolation structure 101 may, for example, include a spin on glass coating 101a and a high-density plasma silicon oxide layer 101b.

Figure 1B:
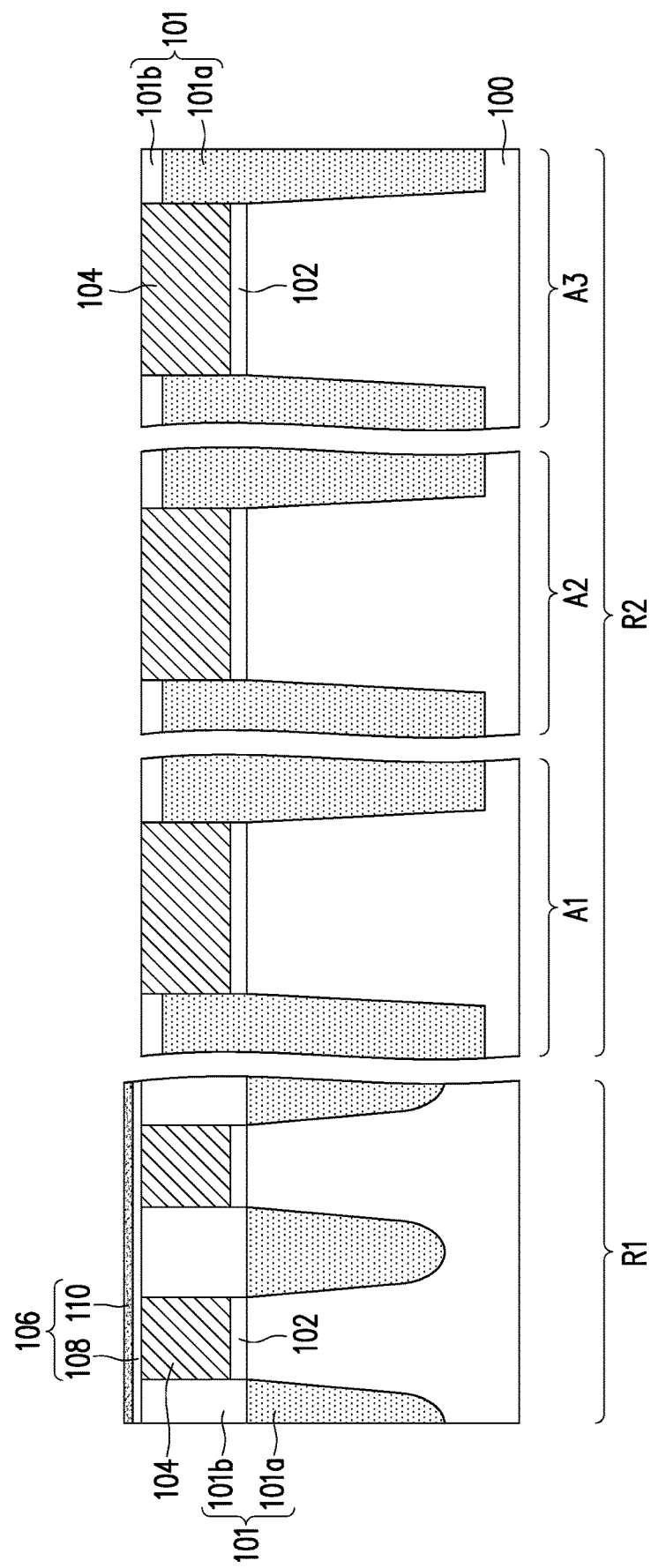

With reference to FIG. 1B, a hard mask layer 106 is formed over the substrate 100 to cover the conductive layer 104 of the cell region R1 and the isolation structure 101. According to one embodiment, the hard mask layer 106 includes a silicon oxide layer 108 and a silicon nitride layer 110, so it may be referred to as a stacked hard mask layer. The hard mask layer 106 may be formed through deposition and photolithography and etching processes.

Figure 1C:
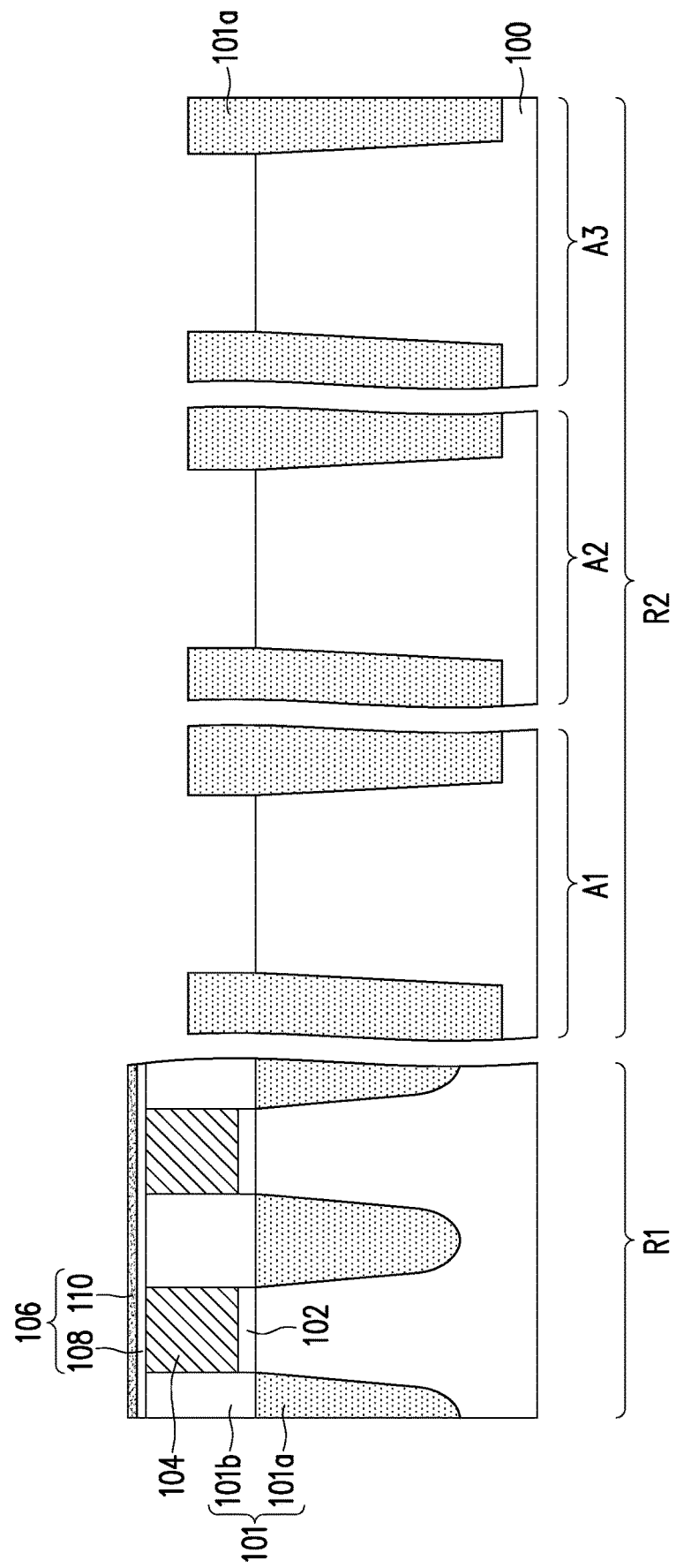

With reference to FIG. 1C, the hard mask layer 106 is taken as a mask, the conductive layer 104 and the tunnel oxide 102 of the peripheral region R2 is removed to expose surface of the substrate 100 of the regions A1, A2, and A3. The conductive layer 104 may be removed through a reactive ion etching process. The tunnel oxide 102 may be removed through a wet etch process (for example, taking diluted hydrofluoric acid as an etchant). According to some embodiments, the high-density plasma silicon oxide layer 101b of the isolation structure 101 of the peripheral region R2 is also removed in the process of removing the silicon oxide layer 108.

Figure 1D:
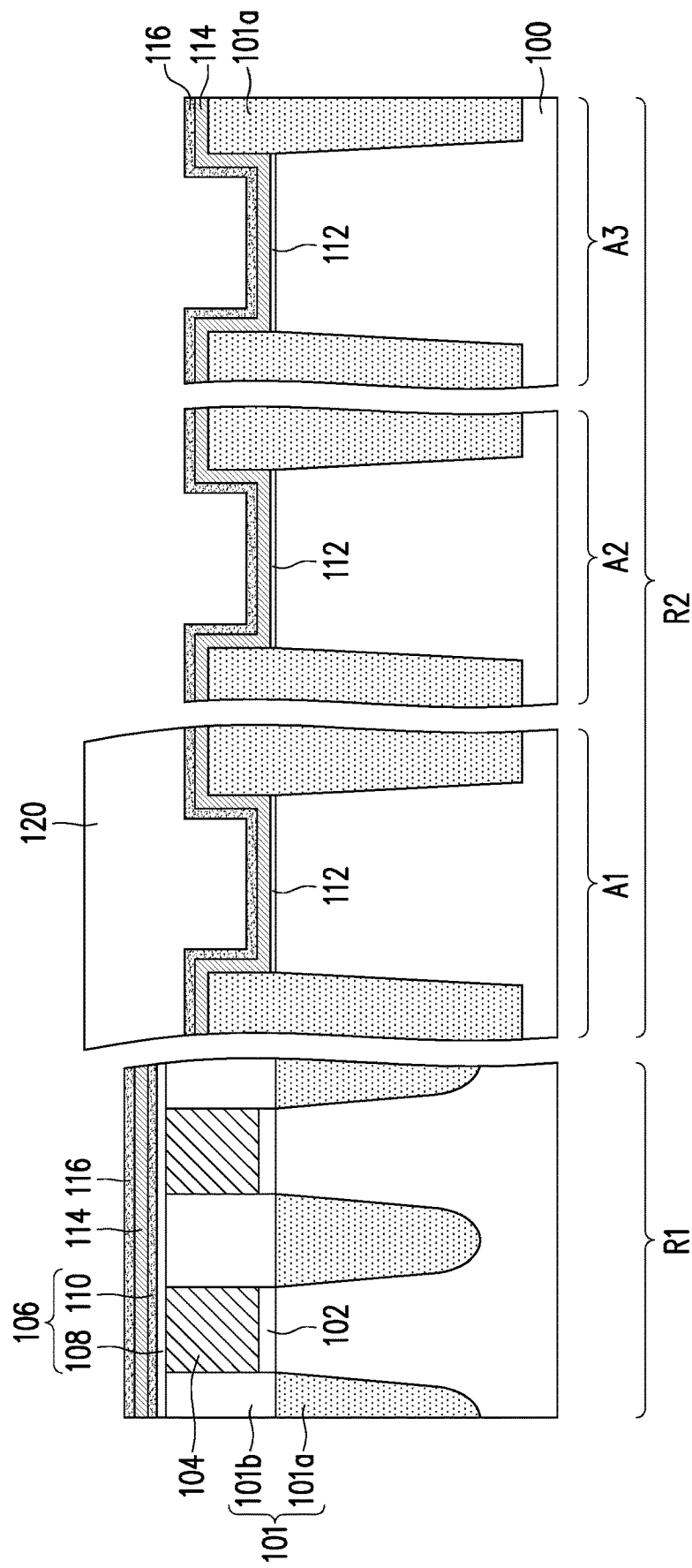

With reference to FIG. 1D, a gate dielectric layer 112 is formed over the substrate 100 of the peripheral region R2, and then a conductive layer 114 and a hard mask layer 116 are formed on the hard mask layer 106 of the cell region R1 and the gate dielectric layer 112 of the peripheral region R2. A material of the gate dielectric layer 112 is, for example, silicon oxide, and the formation method is, for example, thermal oxidation process. The substrate 100 exposed in the peripheral region R2 may be oxidized to form silicon oxide through the thermal oxidation process, while the silicon nitride layer 110 of the cell region R1 cannot be oxidized, so no silicon oxide layer is formed on the silicon nitride layer 110. A material of the conductive layer 114 is, for example, doped polysilicon. A material of the hard mask layer 116 is, for example, silicon nitride. The formation method of the conductive layer 114 and the hard mask layer 116 is, for example, chemical vapor deposition method. A thickness of the gate dielectric layer 112 is, for example, smaller than a thickness of the tunnel oxide 102. The thickness of the gate dielectric layer 112 is, for example, 1 nm to 3 nm. A thickness of the conductive layer 114 is, for example, 10 nm to 20 nm. A thickness of the hard mask layer 116 is, for example, 10 nm to 20 nm.

Afterwards, through a photolithography process, a mask layer 120 (for example, a patterned photoresist layer) is formed over the substrate 100 to cover the hard mask layer 116 of the region A1 of the peripheral region R2.

Figure 1E:
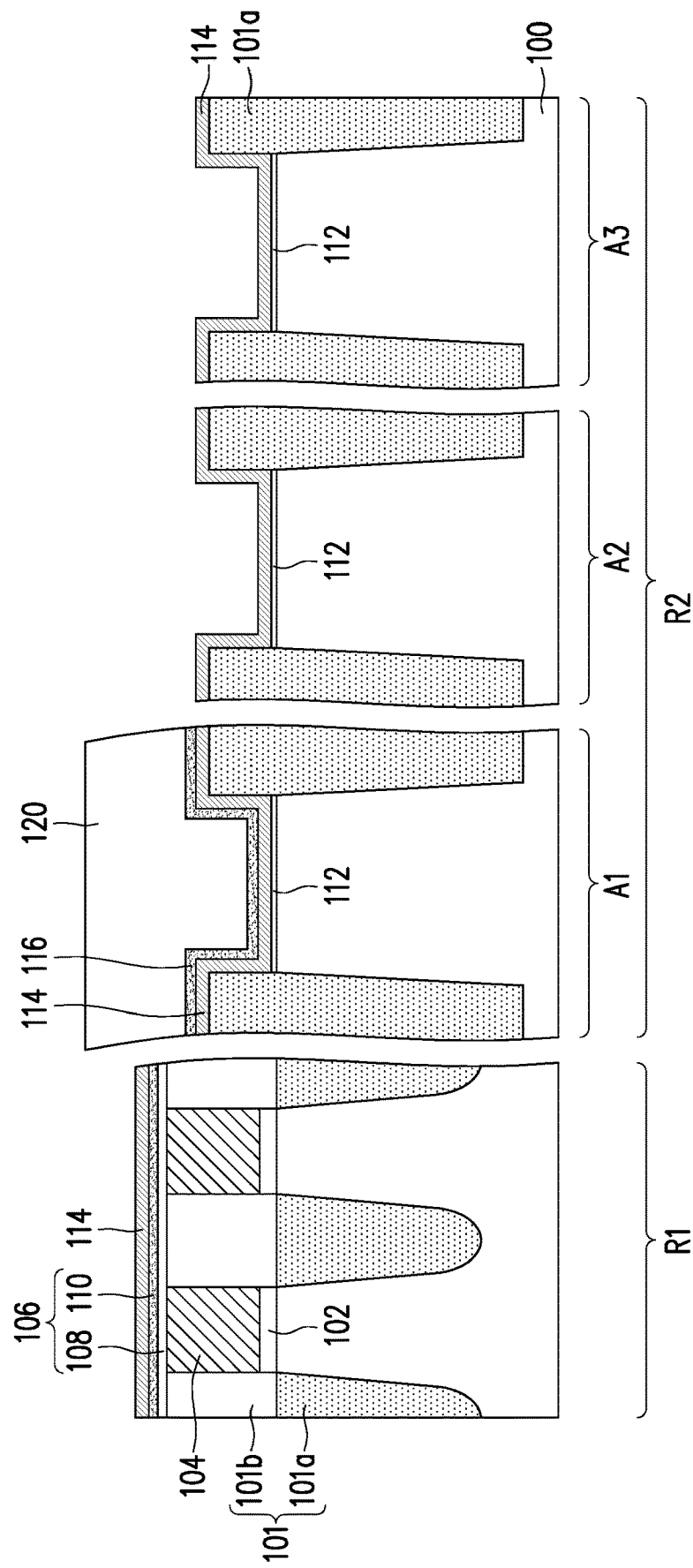

With reference to FIG. 1E, the mask layer 120 of the region A1 of the peripheral region R2 is taken as a mask, and an etching process (for example, a reactive ion etching process) is performed to remove the hard mask layer 116 outside the region A1 of the peripheral region R2.

Figure 1F:
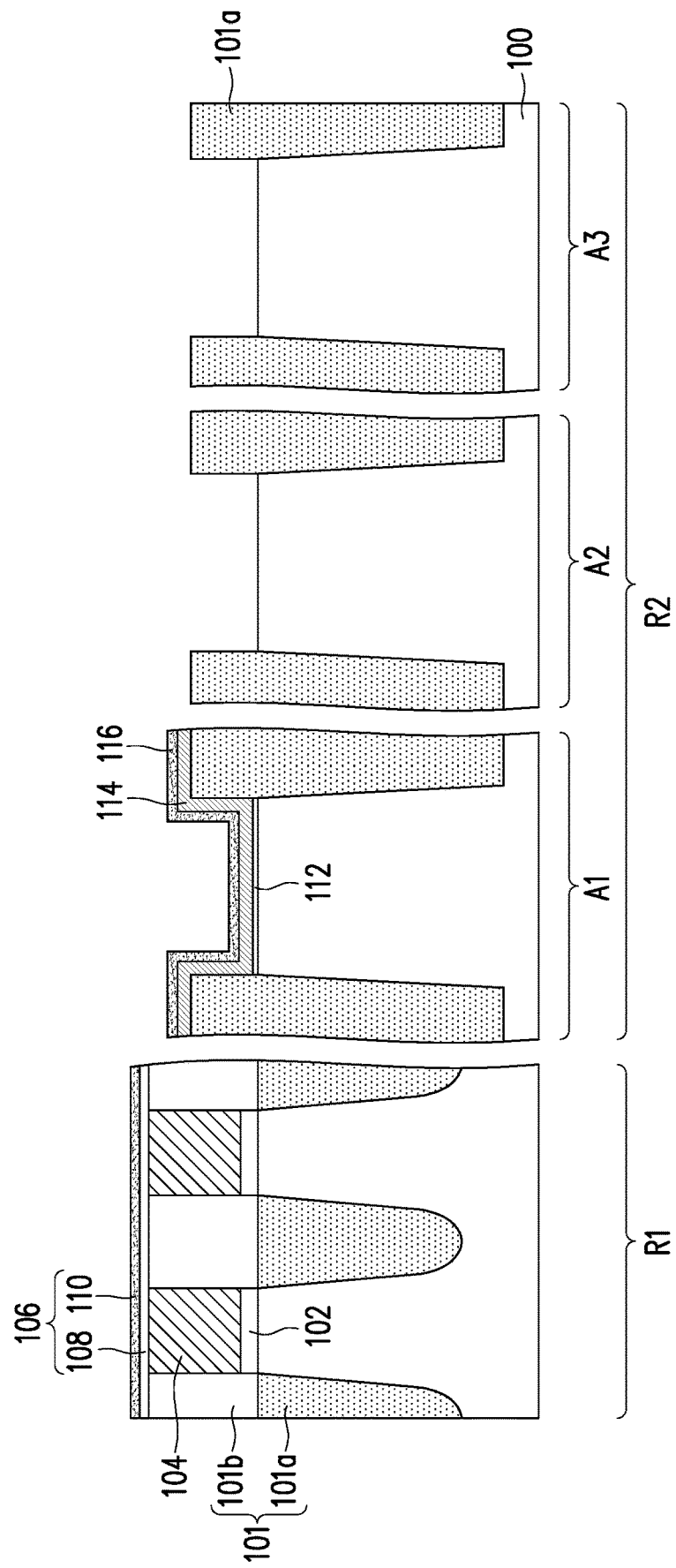

With reference to FIG. 1F, the mask layer 120 is removed. Afterwards, the hard mask layer 116 of the region A1 of the peripheral region R2 is taken as a mask, and the etching process is performed to remove the conductive layer 114 and the gate dielectric layer 112 outside the region A1 of the peripheral region R2, and the hard mask layer 106 of the cell region R1 and surface of the substrate 100 of the regions A2 and A3 of the peripheral region R2 are exposed.

Figure 2:
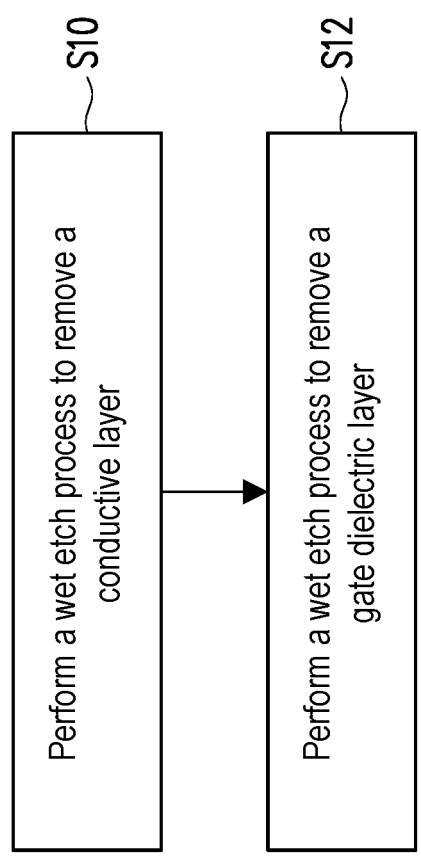
FIG. 2 is an intermediate flow chart of a fabricating method of a semiconductor device according to embodiment of the disclosure.

With reference to FIG. 1F and FIG. 2, the method of removing the conductive layer 114 is, for example, performing the wet etch process with an etchant having high etch selectivity (step S10). The etchant may be a solution containing tetramethylammonium hydroxide (TMAH), such as the commercial cleaning formulation Rezi38 manufactured by J. T. Baker of Mallinckrodt Baker Inc. The gate dielectric layer 112 may be removed through the wet etch process (for example, a diluted hydrofluoric acid solution, step S12). Since the thickness of the gate dielectric layer 112 is very thin, the amount of the gate dielectric layer 112 to be removed is small, the required wet etch process takes a short time and the etching has high etch selectivity, so that the active regions of the device may be prevented from being damaged through etching.

Figure 1G:
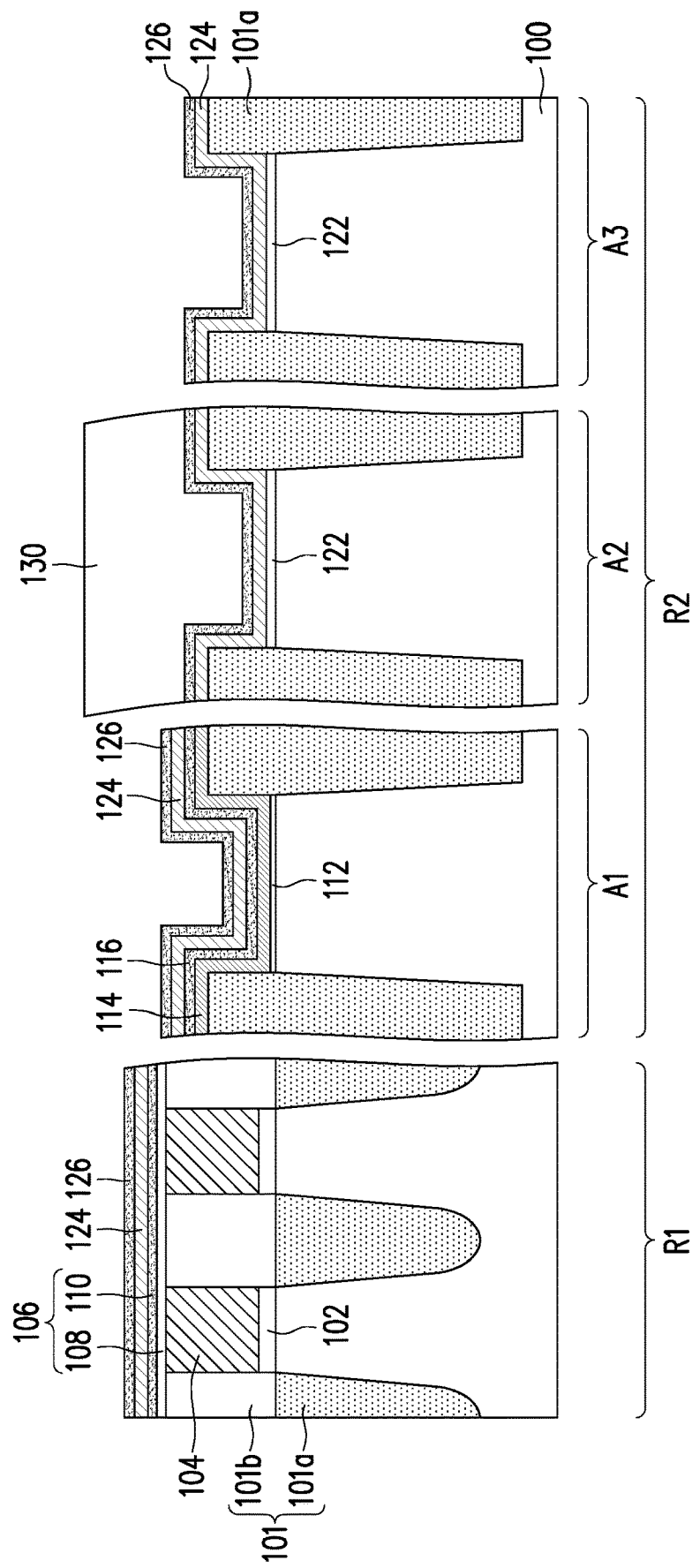

With reference to FIG. 1G, a gate dielectric layer 122 is formed over the substrate 100 of the regions A2 and A3 of the peripheral region R2, and then a conductive layer 124 and a hard mask layer 126 are formed on the hard mask layer 106 of the cell region R1, the hard mask layer 116 on the region A1 of the peripheral region R2, and the gate dielectric layer 122 on the regions A2 and A3 of the peripheral region R2. A material of the gate dielectric layer 122 is, for example, silicon oxide, and the formation method is, for example, thermal oxidation process. The substrate 100 exposed of the regions A2 and A3 of the peripheral region R2 may be oxidized to form silicon oxide through the thermal oxidation process, while the silicon nitride layer 110 of the cell region R1 and the hard mask layer 116 on the region A1 of the peripheral region R2 cannot be oxidized, so no silicon oxide layer is formed on the silicon nitride layer 110 and the hard mask layer 116. A material of the conductive layer 124 is, for example, doped polysilicon. A material of the hard mask layer 126 is, for example, silicon nitride. The formation method of the conductive layer 124 and the hard mask layer 126 is, for example, chemical vapor deposition method. A thickness of the gate dielectric layer 122 is, for example, 5 nm to 7 nm. A thickness of the conductive layer 124 is, for example, 10 nm to 20 nm. A thickness of the hard mask layer 126 is, for example, 10 nm to 20 nm.

Afterwards, a mask layer 130 (for example, a patterned photoresist layer) is formed over the substrate 100 to cover the hard mask layer 126 of the region A2 of the peripheral region R2.

Figure 1H:
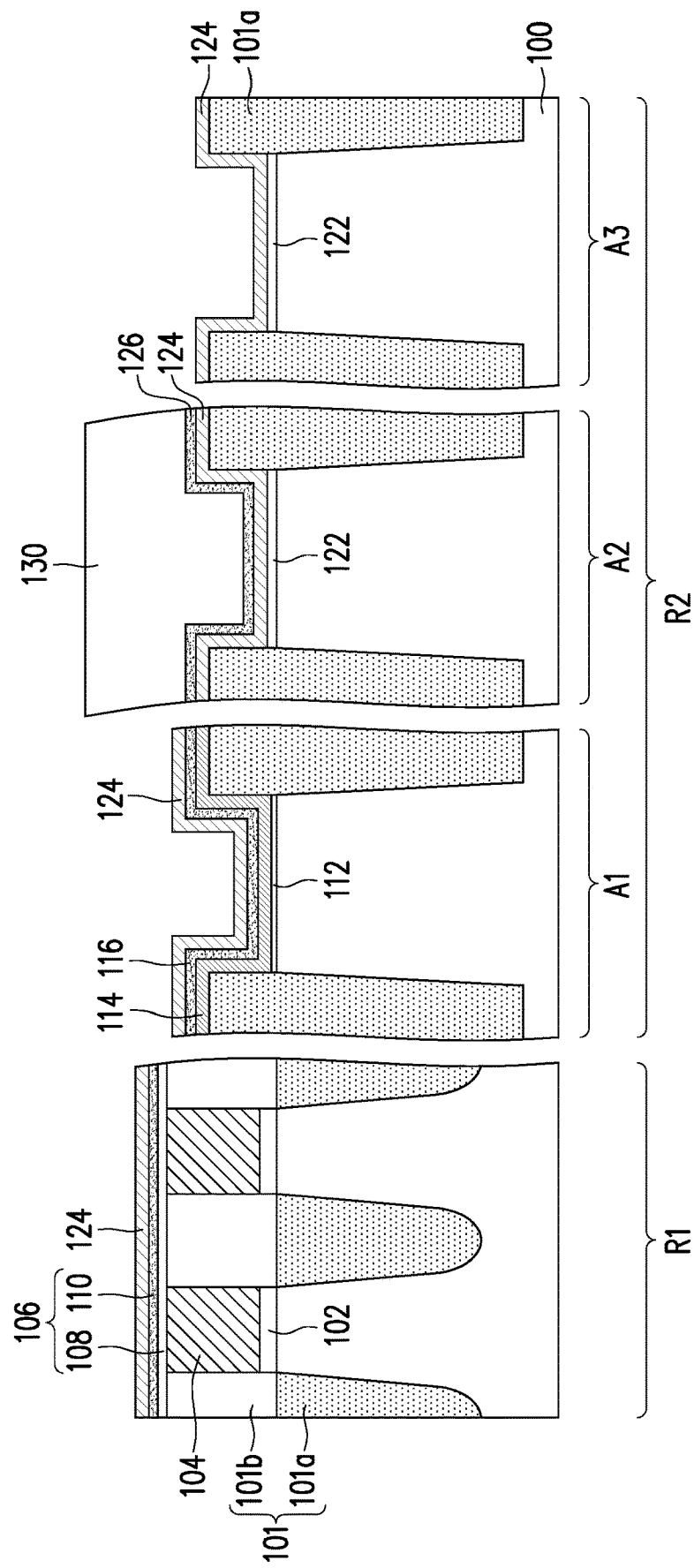

With reference to FIG. 1H, the mask layer 130 of the region A2 of the peripheral region R2 is taken as a mask, and the etching process (for example, the reactive ion etching process) is performed to remove the hard mask layer 126 outside the region A2 of the peripheral region R2.

Figure 1I:
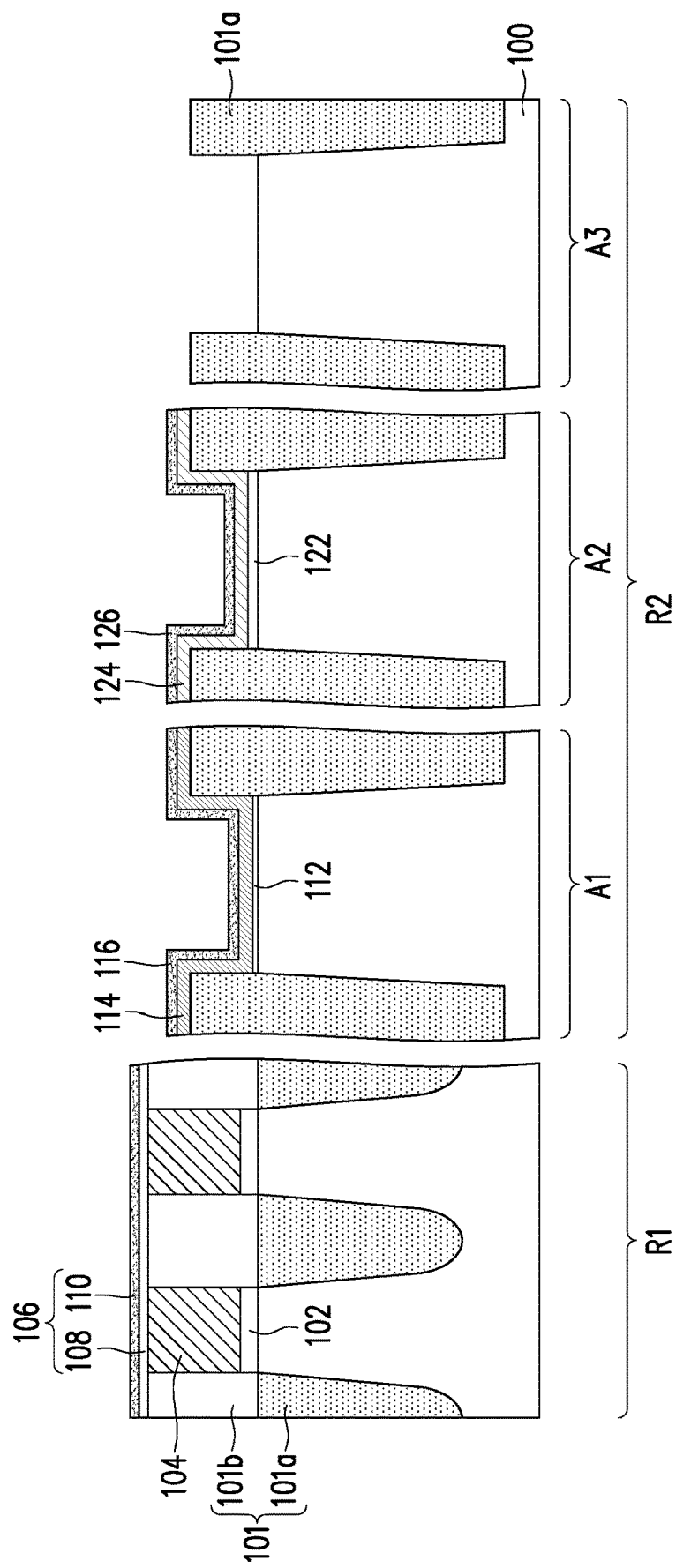

With reference to FIG. 1I and FIG. 2, the mask layer 130 is removed. Afterwards, the hard mask layer 126 of region A2 is taken as a mask, and the etching process (steps S10 and S12) is performed to remove the conductive layer 124 and the gate dielectric layer 122 outside the region A2 of the peripheral region R2, and the hard mask layer 106 of the cell region R1, the hard mask layer 116 of the region A1 of the peripheral region R2, and the surface of the substrate 100 of the region A3 are exposed.

The method of removing the conductive layer 124 is, for example, performing the wet etch process with an etchant having high etch selectivity. The etchant may be a solution containing tetramethylammonium hydroxide, such as the commercial cleaning formula Rezi38 manufactured by J.T. Baker of Mallinckrodt Baker Inc. The gate dielectric layer 122 may be removed through the wet etch process (for example, a diluted hydrofluoric acid solution). Since the thickness of the gate dielectric layer 122 is very thin, the amount of the gate dielectric layer 122 to be removed is small, the required wet etch process takes a short time and the etching has high etch selectivity, so that the active regions of the device may be prevented from being damaged through etching.

Figure 1J:
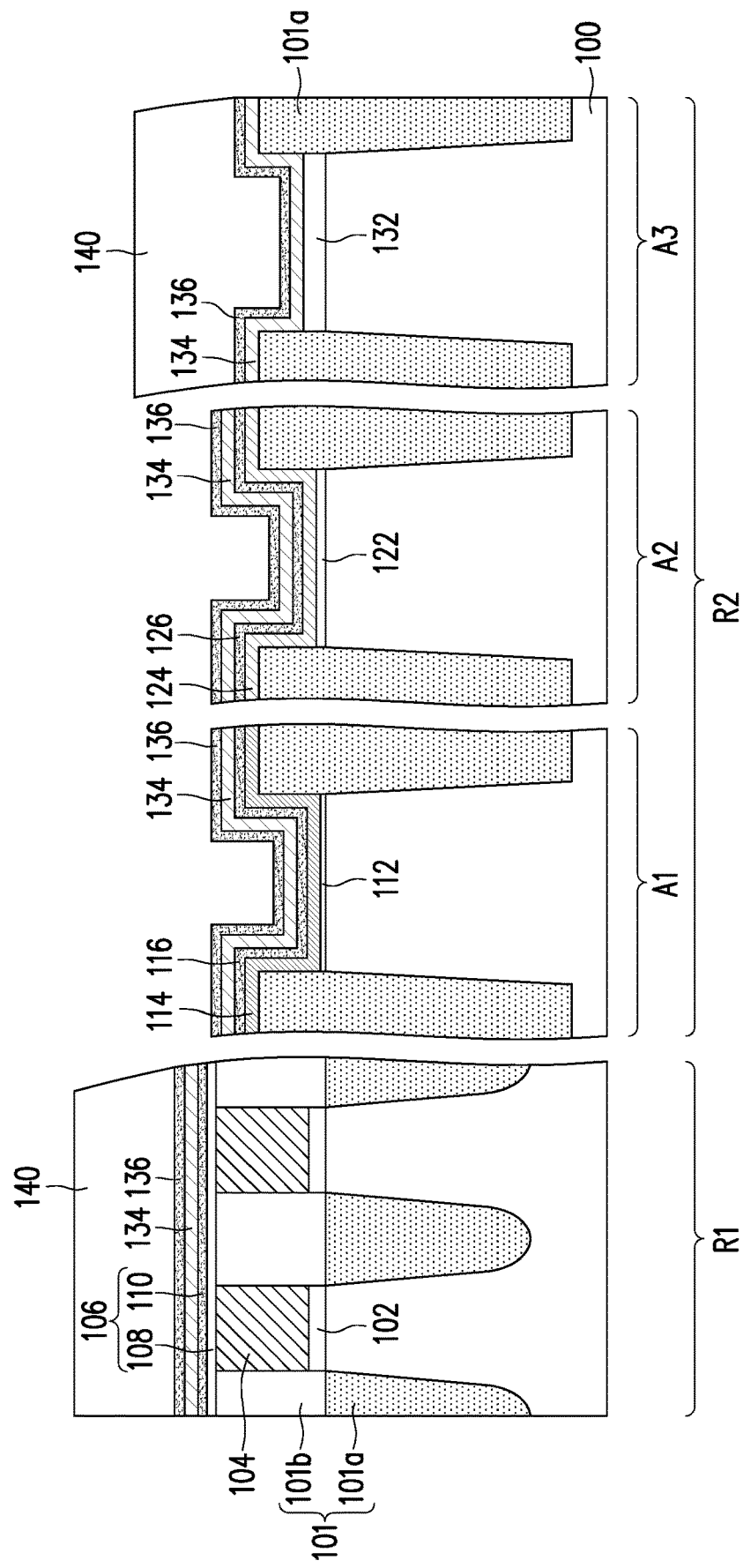

With reference to FIG. 1J, a gate dielectric layer 132 is formed over the substrate 100 of the region A3 of the peripheral region R2, and then a conductive layer 134 and a hard mask layer 136 are formed on the hard mask layer 106 of the cell region R1, the hard mask layer 116 on the region A1 of the peripheral region R2, the hard mask layer 126 on the region A2 of the peripheral region R2, and the gate dielectric layer 132 on the region A3 of the peripheral region R2. A material of the gate dielectric layer 132 is, for example, silicon oxide, and the formation method is, for example, thermal oxidation process. The substrate 100 exposed of the region A3 of the peripheral region R2 may be oxidized through the thermal oxidation process, while the silicon nitride layer 110 of the cell region R1, the hard mask layer 116 of the region A1 of the peripheral region R2, and the hard mask layer 126 of the region A2 cannot be oxidized, so no silicon oxide layer is formed on the silicon nitride layer 110 and the hard mask layers 116 and 126. A material of the conductive layer 134 is, for example, doped polysilicon. A material of the hard mask layer 136 is, for example, silicon nitride. The formation method of the conductive layer 134 and the hard mask layer 136 is, for example, chemical vapor deposition method. A thickness of the gate dielectric layer 132 is, for example, 13 nm to 17 nm. A thickness of the conductive layer 134 is, for example, 10 nm to 20 nm. A thickness of the hard mask layer 136 is, for example, 10 nm to 20 nm.

Afterwards, a mask layer 140 (for example, a patterned photoresist layer) is formed over the substrate 100 to cover the hard mask layer 136 of the cell region R1 and the region A3 of the peripheral region R2.

Figure 1K:
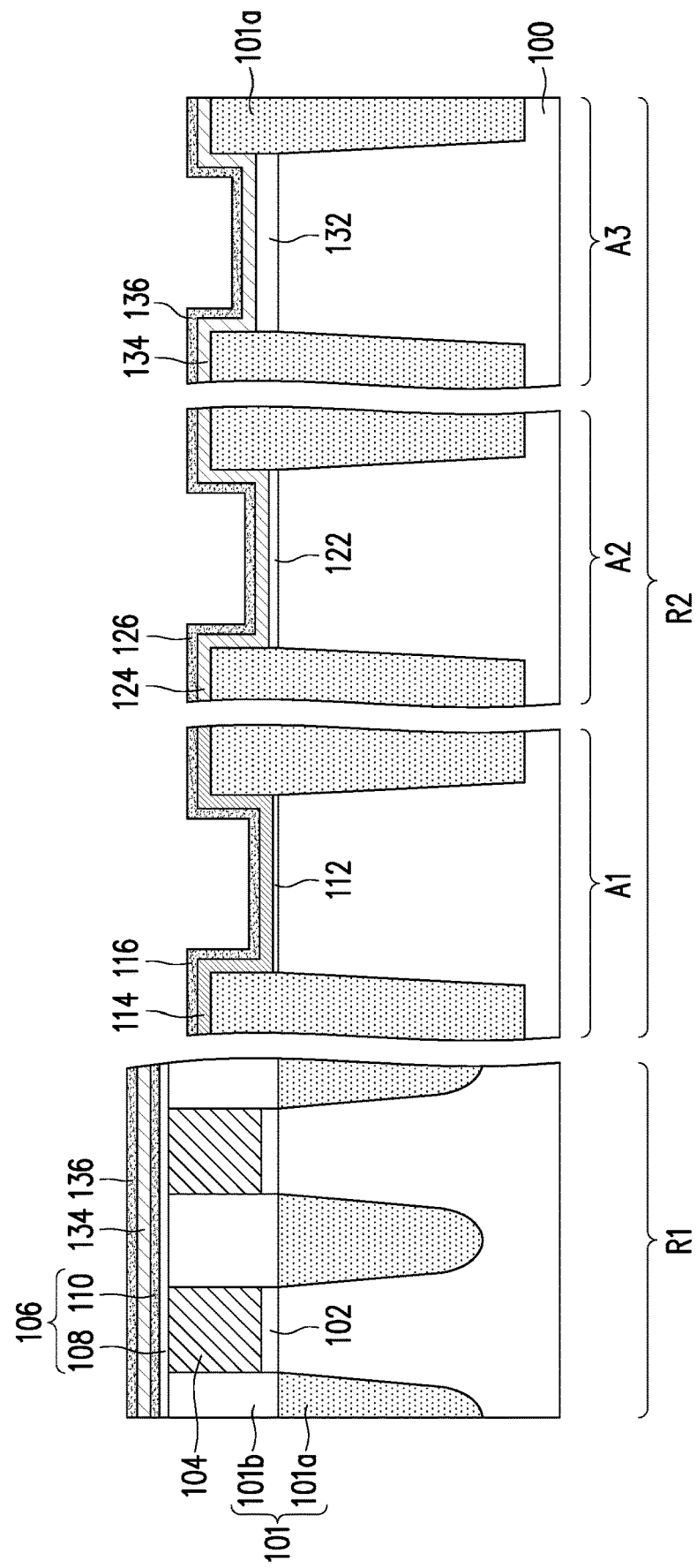

With reference to FIG. 1K, the mask layer 140 of the cell region R1 and the region A3 of the peripheral region R2 is taken as a mask, and the etching process (for example, the reactive ion etching process) is performed to remove the hard mask layer 136 and conductive layer 134 of the cell region R1 and outside the region A3 of the peripheral region R2. Thereafter, the mask layer 140 is removed.

Figure 1L:
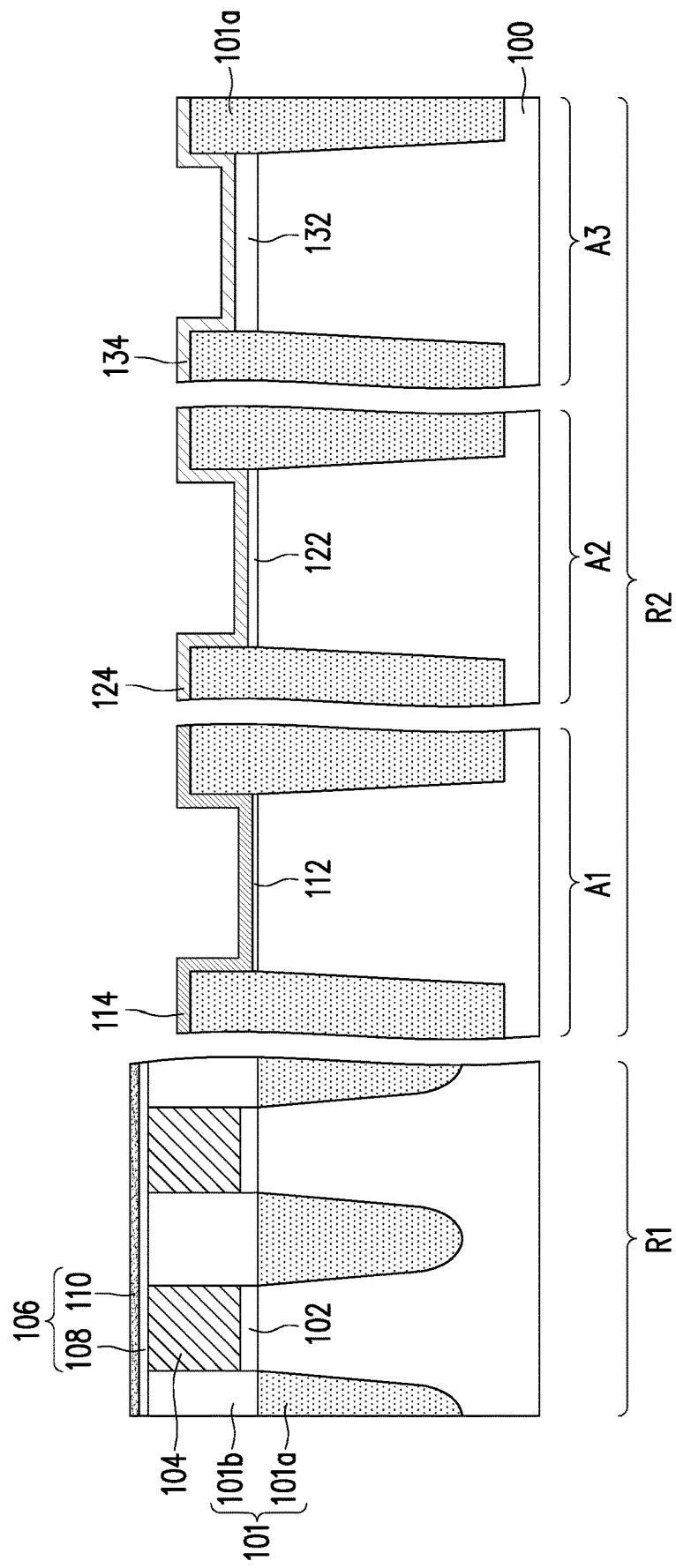

With reference to FIG. 1L, the etching process, such as the reactive ion etching process, is performed to remove the hard mask layers 116, 126 and 136 to expose the hard mask layer 106 of the cell region R1 and the conductive layers 114, 124 and 134 of the peripheral region R2.

Figure 1M:
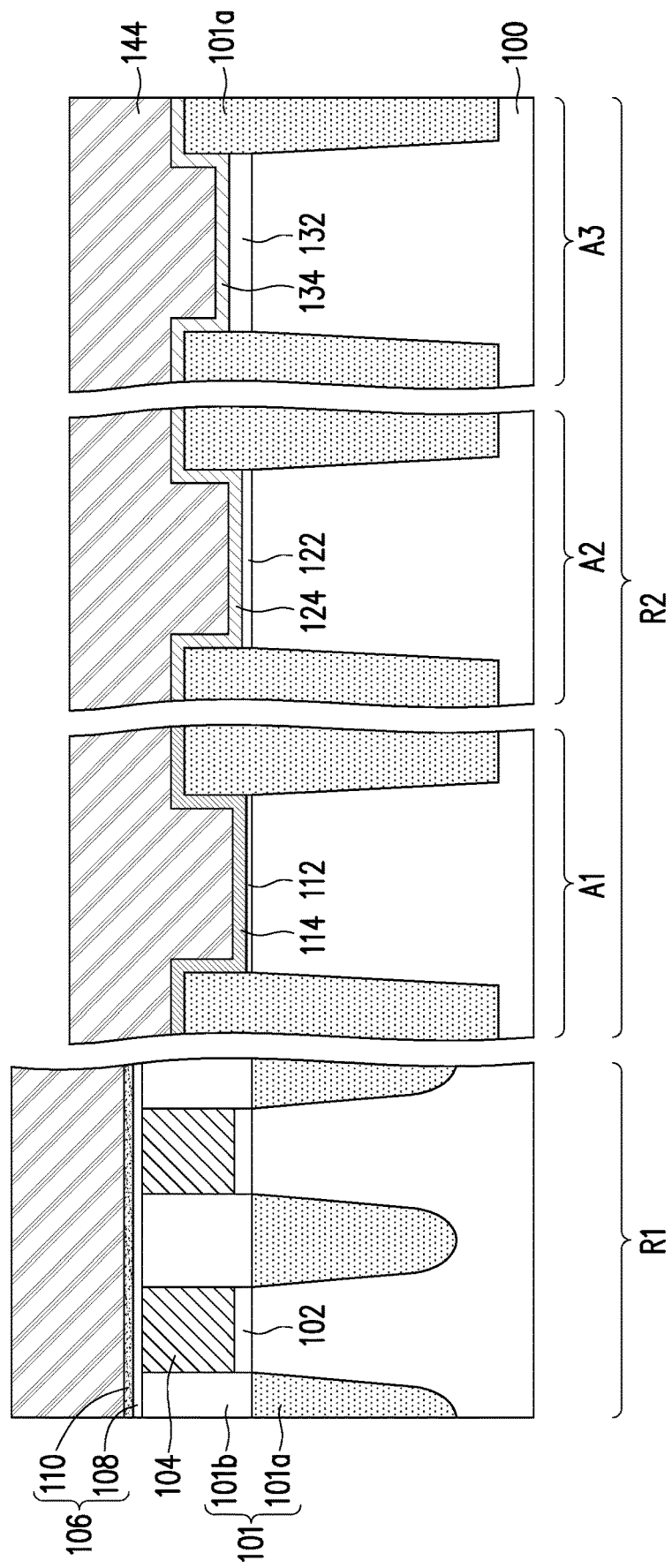

With reference to FIG. 1M, a conductive layer 144 is formed over the substrate 100 to cover the hard mask layer 106 of the cell region R1 and the gate dielectric layers 112, 122, and 132 of the peripheral region R2. A material of the conductive layer 144 is, for example, doped polysilicon. The conductive layer 144 serves as a gate, so it may also be referred to as a gate conductive layer.

Figure 1N:
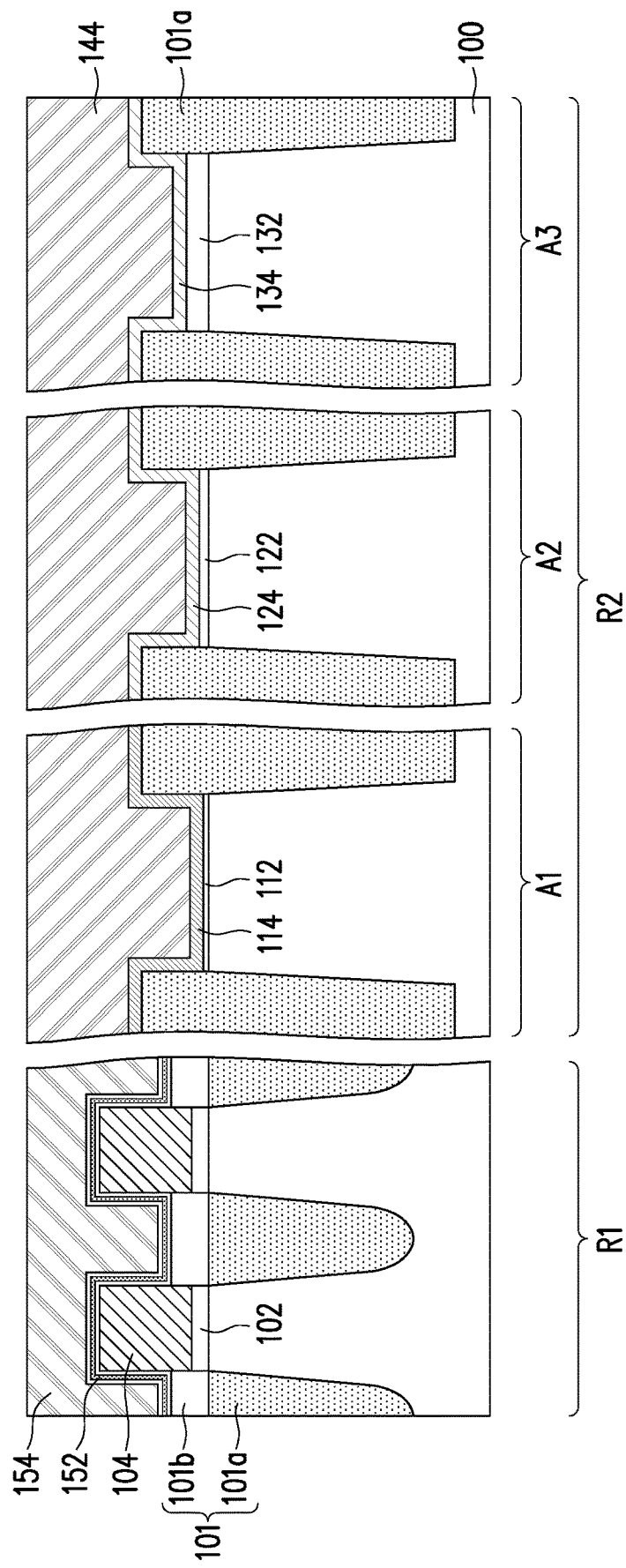

With reference to FIG. 1N, the conductive layer 144 and the hard mask layer 106 of the cell region R1 are removed. Then, a part of the isolation structure 101b in the cell region R1 is removed, so that a top surface of a remaining isolation structure 101b is lower than a top surface of the conductive layer 104. Afterwards, an inter-gate dielectric layer 152 is formed in the cell region R1. The inter-gate dielectric layer 152 is, for example, silicon oxide, silicon nitride, or a combination thereof. According to one embodiment, the inter-gate dielectric layer 152 includes silicon oxide/silicon nitride/stacked silicon oxide layer. Afterwards, a conductive layer 154 is formed on the inter-gate dielectric layer 152. The conductive layer 154 serves as a control gate, and a material thereof is, for example, polysilicon. The formation method of the conductive layer 154 is, for example, forming a conductive material layer in the cell region R1 and the peripheral region R2 of the substrate 100, and then patterning the conductive material layer through a photolithography and etching process.

In summary, according to the embodiment of the disclosure, gate dielectric layers having uniform thickness may be formed to avoid the issue that thickness of the gate dielectric layer at the corner of the active regions of the isolation structure becomes thinner, so that issues, such as leakage current and current double hump, may be avoided. In addition, according to the embodiment of the disclosure, a thin gate dielectric layer of a transistor with an initial voltage relatively small is first formed in each region of a peripheral circuit region, and then a thin gate dielectric layer on a region of a transistor with an initial voltage relatively large is removed. Since a thickness of the gate dielectric layer of the transistor with an initial voltage relatively small is relatively thin, the wet etch process to remove the thin gate dielectric layer takes less time, which is less likely to cause the leakage current and current double hump issues. In addition, according to the embodiment of the disclosure, the conductive layer on the region of the transistor with an initial voltage relatively large is removed through the wet etch process with high etch selectivity, so that the active regions of the device may be prevented from being damaged through etching.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A fabricating method of a semiconductor device comprising:
    providing a substrate comprising a cell region and a peripheral region, wherein the peripheral region comprises a first region and a second region;
    forming a tunnel oxide, a floating conductive layer, and a stacked hard mask layer in the cell region and the peripheral region;
    taking the stacked hard mask layer as a mask and removing the floating conductive layer and the tunnel oxide in the first region and the second region;
    forming a first gate dielectric layer over the substrate of the first region and the second region of the peripheral region, and forming a first conductive layer and a first hard mask layer in the first region and the second region of the cell region and the peripheral region;
    removing the first hard mask layer outside the first region;
    taking the first hard mask layer as a mask and removing the first conductive layer and the first gate dielectric layer outside the first region;
    removing the first hard mask layer and the first conductive layer; and
    forming a first gate conductive layer in the first region.

2. The fabricating method of a semiconductor device according to claim 1, wherein taking the first hard mask layer as a mask and removing the first conductive layer and the first gate dielectric layer outside the first region comprises a wet etch process.

3. The fabricating method of a semiconductor device according to claim 2, wherein the wet etch process comprises taking a solution containing tetramethylammonium hydroxide as an etchant.

4. The fabricating method of a semiconductor device according to claim 1, wherein a thickness of the first gate dielectric layer is less than a thickness of the tunnel oxide.

5. The fabricating method of a semiconductor device according to claim 1 further comprising:
before forming the first gate conductive layer in the first region,
forming a second gate dielectric layer over the substrate in the second region of the peripheral region, and forming a second conductive layer and a second hard mask layer in the cell region and the first region and the second region of the peripheral region;
forming a second mask layer on the second hard mask layer in the second region;
taking the second mask layer as a mask and removing the second hard mask layer outside the second region;
removing the second mask layer;
taking the second hard mask layer as a mask and removing the second conductive layer and the second gate dielectric layer outside the second region;
removing the second hard mask layer and the second conductive layer at the same time when removing the first hard mask layer and the first conductive layer; and
forming the second gate conductive layer in the second region at the same time when forming the first gate conductive layer in the first region.

6. The fabricating method of a semiconductor device according to claim 5, wherein a thickness of the second gate dielectric layer is greater than a thickness of the first gate dielectric layer.

7. The fabricating method of a semiconductor device according to claim 5 further comprising:
before forming the second gate conductive layer in the second region,
forming a third gate dielectric layer over the substrate of a third region of the peripheral region, and forming a third conductive layer and a third hard mask layer in the cell region and the first region and the second region of the peripheral region;
forming a third mask layer on the third hard mask layer in the third region;
taking the third mask layer as a mask and removing the third hard mask layer and the second conductive layer outside the third region;
removing the third hard mask layer and the third conductive layer at the same time when removing the first hard mask layer and the first conductive layer; and
forming the second gate conductive layer in the third region at the same time when forming the first gate conductive layer in the first region.

8. The fabricating method of a semiconductor device according to claim 7, wherein a thickness of the third gate dielectric layer is greater than a thickness of the second gate dielectric layer.

9. The fabricating method of a semiconductor device according to claim 7 further comprising:
removing the stacked hard mask layer;
forming an inter-gate dielectric layer on the floating conductive layer of the cell region; and
forming a control conductive layer on the inter-gate dielectric layer.

10. A fabricating method of a semiconductor device comprising:
providing a substrate comprising a cell region and a peripheral region, wherein the peripheral region comprises a first region and a second region;
forming a first gate dielectric layer over the substrate of the first region and the second region of the peripheral region, and forming a first conductive layer and a first hard mask layer in the first region and the second region of the cell region and the peripheral region;
forming a first mask layer on the first hard mask layer in the first region;
taking the first mask layer as a mask and removing the first hard mask layer outside the first region;
removing the first mask layer;
taking the first hard mask layer as a mask and performing a wet etch process to remove the first conductive layer and the first gate dielectric layer outside the first region;
removing the first hard mask layer and the first conductive layer;
forming a first gate dielectric layer in the second region; and
forming a first gate conductive layer in the first region, and forming a second gate conductive layer in the second region.

11. The fabricating method of a semiconductor device according to claim 10, wherein removing the first conductive layer outside the first region comprises taking a solution containing tetramethylammonium hydroxide as an etchant.

12. The fabricating method of a semiconductor device according to claim 10, wherein a thickness of the second gate dielectric layer is greater than a thickness of the first gate dielectric layer.

13. The fabricating method of a semiconductor device according to claim 10 further comprising forming a third gate dielectric layer in the third region of the peripheral region of the substrate; and
forming the third gate conductive layer in the third region at the same time when forming the first gate conductive layer in the first region and forming the second gate conductive layer in the second region.

14. The fabricating method of a semiconductor device according to claim 13, wherein a thickness of the third gate dielectric layer is greater than a thickness of the second gate dielectric layer.

* * * * *